(12) United States Patent
Harada et al.

(10) Patent No.: US 9,537,002 B2
(45) Date of Patent: Jan. 3, 2017

(54) SEMICONDUCTOR DEVICE WITH SIC BASE LAYER

(71) Applicant: FUJI ELECTRIC CO., LTD., Kawasaki-shi, Kanagawa (JP)

(72) Inventors: Yuichi Harada, Matsumoto (JP); Noriyuki Iwamuro, Tsukuba (JP); Yasuyuki Hoshi, Matsumoto (JP); Shinsuke Harada, Tsukuba (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/389,242

(22) PCT Filed: Mar. 18, 2013

(86) PCT No.: PCT/JP2013/057739
§ 371 (c)(1),
(2) Date: Sep. 29, 2014

(87) PCT Pub. No.: WO2013/146445
PCT Pub. Date: Oct. 3, 2013

(65) Prior Publication Data
US 2015/0053998 A1   Feb. 26, 2015

(30) Foreign Application Priority Data
Mar. 30, 2012 (JP) .................. 2012-081171

(51) Int. Cl.
*H01L 29/15* (2006.01)
*H01L 29/78* (2006.01)
(Continued)

(52) U.S. Cl.
CPC ......... *H01L 29/7827* (2013.01); *H01L 21/049* (2013.01); *H01L 29/1095* (2013.01);
(Continued)

(58) Field of Classification Search
CPC ............. H01L 29/1095; H01L 29/0692; H01L 29/7802
See application file for complete search history.

(56) References Cited

U.S. PATENT DOCUMENTS 4,947,226 A * 8/1990 Huang ................ H01L 29/0696
257/122
5,750,416 A * 5/1998 Hshieh ................ H01L 29/0696
148/DIG. 126
(Continued)

FOREIGN PATENT DOCUMENTS

JP  62-31169 A   2/1987
JP  10-112545 A  4/1988
(Continued)

OTHER PUBLICATIONS

International Search Report dated Jun. 25, 2013 issued in corresponding application No. PCT/JP2013/057739.
(Continued)

*Primary Examiner* — Thao X Le
*Assistant Examiner* — Laura Dykes
(74) *Attorney, Agent, or Firm* — Westerman, Hattori, Daniels & Adrian, LLP

(57) ABSTRACT

A base layer is used that has an N-type SiC layer formed in a surface layer on the front surface side of an N-type SiC substrate, and a P-type region is formed on a surface of the N-type SiC layer with an N-type source region selectively formed in a surface layer of the P-type region. A source electrode is formed on a surface of the N-type source region and a drain electrode is formed on the back surface side of the N-type SiC substrate. Additionally, the gate electrode is formed via a gate insulation film only on a surface of the P-type region. In this way, high electric field is no longer applied to the gate insulation film on the surface of the
(Continued)

N-type SiC layer due to stoppage of voltage application to the gate electrode.

9 Claims, 6 Drawing Sheets

(51) Int. Cl.
    *H01L 21/04* (2006.01)
    *H01L 29/66* (2006.01)
    *H01L 29/16* (2006.01)
    *H01L 29/423* (2006.01)
    *H01L 29/10* (2006.01)
    *H01L 29/06* (2006.01)
    *H01L 29/08* (2006.01)

(52) U.S. Cl.
    CPC ...... *H01L 29/1608* (2013.01); *H01L 29/4238* (2013.01); *H01L 29/42372* (2013.01); *H01L 29/42376* (2013.01); *H01L 29/66068* (2013.01); *H01L 29/7802* (2013.01); *H01L 29/0696* (2013.01); *H01L 29/0878* (2013.01)

(56) References Cited

U.S. PATENT DOCUMENTS

| | | | |
|---|---|---|---|
| 6,384,428 B1 * | 5/2002 | Oono et al. | ............ 257/77 |
| 2003/0201456 A1 | 10/2003 | Saitoh et al. | |
| 2003/0227052 A1 | 12/2003 | Ono et al. | |
| 2004/0046202 A1 * | 3/2004 | Nakayama et al. | ......... 257/302 |
| 2006/0057796 A1 | 3/2006 | Harada et al. | |
| 2007/0045727 A1 | 3/2007 | Shiraishi et al. | |
| 2010/0102381 A1 | 4/2010 | Saito et al. | |
| 2010/0258815 A1 * | 10/2010 | Tarui | ............... 257/77 |
| 2010/0283083 A1 | 11/2010 | Niiyama et al. | |
| 2013/0248981 A1 | 9/2013 | Okumura et al. | |

FOREIGN PATENT DOCUMENTS

| | | |
|---|---|---|
| JP | 2-216871 A | 8/1990 |
| JP | 4-75388 A | 3/1992 |
| JP | 10-107263 A | 4/1998 |
| JP | 2003298052 A | 10/2003 |
| JP | 2004006598 A | 1/2004 |
| JP | 2007-059636 A | 3/2007 |
| JP | 2009-4573 A | 1/2009 |
| JP | 2010103337 A | 5/2010 |
| JP | 2011023757 A | 2/2011 |
| JP | 2012064873 A | 3/2012 |
| WO | 2007/145279 A1 | 12/2007 |

OTHER PUBLICATIONS

Notification of Transmittal of Translation of the International Preliminary Report on Patentability dated Oct. 9, 2014 (form PCT/IB/338), issued in International Application No. PCT/JP2013/057739, with form PCT/IPEA/409 (6 pages).

Office Action dated Jun. 2, 2015, issued in counterpart Japanese patent application No. 2012-081171, with partial English translation (5 pages).

Office Action dated Mar. 15, 2016, issued in counterpart Japanese Patent Application No. 2012-081171, with English translation. (8 pages).

* cited by examiner

RELATED ART

SEMICONDUCTOR DEVICE WITH SIC BASE LAYER

TECHNICAL FIELD

The present invention relates to a semiconductor device used as a switching device.

BACKGROUND ART

A vertical MOSFET (Metal oxide semiconductor field-effect transistor) is a widely known semiconductor device. In a proposed vertical MOSFET, a source electrode and a gate electrode formed via a gate insulation film are disposed on one surface of a semiconductor; a drain electrode is disposed on the other surface of the semiconductor; the semiconductor includes a base layer performing a function of one conductive type among N and P types, a first portion partially formed on a given surface of the base layer to perform a function of the other conductive type among N and P types, and a second portion partially formed on a surface of the first portion to perform a function of the one conductive type and having a surface connected to the source electrode; the given surface of the base layer, the surface of the first portion, and the surface of the second portion are exposed as constituent surfaces of one surface of the semiconductor; the first portion is located to be interposed between the given surface of the base layer and the surface of the second portion; and the drain electrode is disposed on the other surface of the base layer (see, e.g., Patent Document 1 (FIG. 3, etc.)).

FIG. 10 is a cross-sectional diagram of a cross section structure of a conventional MOSFET. As depicted in FIG. 10, for example, in the vertical MOSFET, a base layer of a semiconductor is a layer including an N-type SiC substrate 1 and an N-type SiC layer 2 formed on one surface of the N-type SiC substrate 1. Multiple P-type regions 3 are formed as the first portion in a surface layer of the N-type SiC layer 2 (a surface layer on the opposite side to the N-type SiC substrate 1 side). An N-type source region 4 and a P-type contact region 5 are formed as the second portion in the surface layer of the P-type region 3 (a surface layer on the opposite side to the N-type SiC substrate 1 side). A source electrode 8 is formed on the surfaces of the N-type source region 4 and the P-type contact region 5. A gate electrode 7 is formed via a gate insulation film 6 on one surface of the N-type SiC layer 2 (a surface on the opposite side to the N-type SiC substrate 1 side) and a surface of the P-type region 3 between the N-type SiC layer 2 and the N-type source region 4. A drain electrode 9 is formed on the other surface (back surface) of the N-type SiC substrate 1.

FIG. 11 is a cross-sectional diagram of a cross section structure of another conventional MOSFET. As depicted in FIG. 11, in another vertical MOSFET, a base layer of a semiconductor is used that has the N-type SiC layer 2 formed on one surface of the N-type SiC substrate 1, and multiple P-type regions 10 (the first portion) are formed in a surface layer of the N-type SiC layer 2 (a surface layer on a side opposite to the N-type SiC substrate 1 side). A P-type SiC layer 11 (the first portion) is formed on a surface of each of the P-type regions 10 and a surface of the N-type SiC layer 2 (a surface on the opposite side to the N-type SiC substrate 1 side). An N-type source region 4 and a P-type contact region 5 are formed as the second portion in a surface layer of the P-type SiC layer 11 (a surface layer on the opposite side to the N-type SiC substrate 1 side). The source electrode 8 is formed on the surfaces of the N-type source region 4 and the P-type contact region 5. On the other hand, an N-type region 12 is formed in the P-type SiC layer 11 on a region where the N-type SiC layer 2 exists without formation of the P-type region 10 such that the N-type SiC layer 2 appears. The gate electrode 7 is formed via the gate insulation film 6 on a surface of the N-type region 12 and a surface of the P-type SiC layer 11 between the N-type region 12 and the N-type source region 4. The drain electrode 9 is formed on the other surface (back surface) of the N-type SiC substrate 1.

In these vertical MOSFETs, when a positive voltage is applied to the drain electrode 9 relative to the source electrode 8, if a voltage less than a gate threshold value is applied to the gate electrode 7, PN-junction between the P-type region 3 and the N-type SiC layer 2 (see FIG. 10) or PN-junction between the P-type SiC layer 11 and the N-type region 12 (see FIG. 11) is inversely-biased and therefore, no current flows. On the other hand, if a voltage equal to or greater than the gate threshold value is applied to the gate electrode 7, the formation of an inversion layer on the surface of the P-type region 3 (see FIG. 10) or the surface of the P-type SiC layer 11 (see FIG. 11) immediately below the gate electrode 7 causes current to flow. Thus, the switching operation of the MOSFETs can be achieved by the voltage applied to the gate electrode 7.

Patent Document 1: Japanese Laid-open Patent Publication No. H10-107263

DISCLOSURE OF INVENTION

Problem to be Solved by the Invention

Nonetheless, if high voltage is applied to the drain electrode 9 in the MOSFET, particularly when the MOSFET (the gate electrode 7) is turned off, high voltage is applied between the drain electrode 9 and the gate electrode 7. In this case, if a high electric field is applied to the gate insulation film 6, the dielectric breakdown of the gate insulation film 6 may occur or the reliability of the gate insulation film 6 may significantly be reduced. The dielectric breakdown electric field of 4H-SiC is $2.8 \times 10^6$ V/cm, which is higher than $1 \times 10^6$ V/cm for $SiO_2$, and therefore, when the applied voltage is divided between SiC and $SiO^2$ (withstand voltage), a problem arises in that before the SiC starts avalanche breakdown (reach the dielectric breakdown electric field), the $SiO_2$ breaks down. On the other hand, since the dielectric breakdown electric field of Si is $3 \times 10^5$ V/cm, which is lower than that for $SiO_2$, avalanche breakdown starts by Si before $SiO_2$ reaches the dielectric breakdown electric field, breakdown of the $SiO_2$ does not occur easily. Therefore, in the case of a SiC MOS gate device, if the voltage (electric field) distributed to the gate oxidation film is not reduced, a problem arises in that the when avalanche breakdown occurs, the gate oxidation film may be damaged.

An object of the present invention is to provide a semiconductor device capable of improving dielectric breakdown and the reliability of an insulation film while the original function of MOSFET is maintained so as to solve the problems of the conventional technique described above.

Means for Solving Problem

To solve the problems above and achieve an object, a semiconductor device according to the present invention has the following characteristics. The semiconductor device includes a source electrode formed on a first surface of a semiconductor; a gate electrode formed via an insulation film on the first surface of the semiconductor; and a drain electrode formed on a second surface of the semiconductor. The semiconductor has a base layer performing a function of a first conductive type among N and P types, a first portion partially formed in a surface layer of a first surface of the base layer to perform a function of a second conductive type among N and P types, and a second portion partially formed inside the first portion to perform a function of the first conductive type, the second portion being connected to the source electrode. The first surface of the base layer, a surface of the first portion, and a surface of the second portion are exposed as constituent surfaces of the first surface of the semiconductor. The first portion is positioned to be interposed between the base layer and the second portion on the first surface side of the base layer. A second surface of the base layer is the second surface of the semiconductor. The gate electrode is disposed on the surface of the first portion such that the first surface of the base layer is excluded as an arrangement position of the gate electrode. The base layer is made up of a silicon carbide substrate performing a function of the first conductive type, and a first silicon carbide layer formed on a first surface of the silicon carbide substrate, having an impurity concentration that is lower than an impurity concentration of the silicon carbide substrate, and performing a function of the first conductive type. The drain electrode is connected to a second surface of the silicon carbide substrate. The first portion is formed inside the first silicon carbide layer.

In the semiconductor device according to the present invention, the one surface of the base layer is exposed as a band-like base layer partial surface on the one surface of the semiconductor. The surface of the first portion and the surface of the second portion are respectively arranged along the base layer partial surface, on each side in the direction of the width of the base layer partial surface, and are arranged sequentially outward from the each side, along a direction of width of the base layer partial surface. The surface of the first portion and the surface of the second portion are extended along an extending direction perpendicular to the width direction of the base layer partial surface.

In the semiconductor device according to the present invention, the base layer partial surfaces are disposed in plural on the one surface of the semiconductor, and the base layer partial surfaces are arranged to be parallel with one another at a given interval.

In the semiconductor device according to the present invention, the base layer partial surfaces are disposed in plural on the one surface of the semiconductor. The base layer partial surfaces are arranged in a pair of outside lines disposed in parallel at an interval and intermediate rows positioned between the pair of outside lines. In each of the outside lines, the base layer partial surfaces are arranged to be aligned and face one another, at intervals outward along a direction of width. In the intermediate rows, the base layer partial surfaces are disposed between the respective adjacent base layer partial surfaces in the outside lines and extend along the direction of width.

In the semiconductor device according to the present invention, the first portion is made up of a first region formed inside the first silicon carbide layer and performing a function of the second conductive type, and a second silicon carbide layer formed on a surface of the first silicon carbide layer and a surface of the first region to perform a function of the second conductive type. The second portion is formed inside the second silicon carbide layer. The base layer includes an extension region formed inside the second silicon carbide layer and continued to the first silicon carbide layer to perform a function of the first conductive type same as the base layer.

To solve the problems above and achieve an object, the semiconductor device according to the present invention has the following characteristics. The semiconductor device includes a source electrode formed on a first surface of a semiconductor; a gate electrode formed via an insulation film on the first surface of the semiconductor; and a drain electrode formed on a second surface of the semiconductor. The semiconductor has a base layer performing a function of a first conductive type among N and P types, a first portion partially formed in a surface layer of a first surface of the base layer to perform a function of a second conductive type among N and P types, and a second portion partially formed inside the first portion to perform a function of the first conductive type, the second portion being connected to the source electrode. The first surface of the base layer, a surface of the first portion, and a surface of the second portion are exposed as constituent surfaces of the first surface of the semiconductor. The first portion is positioned to be interposed between the base layer and the second portion on the first surface side of the base layer. A second surface of the base layer is the second surface of the semiconductor. The gate electrode is formed to be continuous between a corner of the second portion and a corner of a given second portion that does not face an edge of the second portion, and is formed to be discontinuous between the edge of the second portion and an edge of an arbitrary second portion that faces the edge of the second portion.

According to the present invention, since the gate electrode is disposed on the surface of the first portion, when a voltage equal to or greater than a certain value (threshold voltage) is applied to the gate electrode, a channel acting as an inversion layer can be generated in the surface layer of the first portion immediately under the gate electrode to allow current to flow between the source electrode and the drain electrode through the channel and the application of voltage to the gate electrode can be stopped to cause the channel to disappear so that no current is allowed to flow (the original function of the MOSFET).

According to the present invention, since one surface of the base layer is excluded as an arrangement position of the gate electrode, a high electric field is no longer applied to the gate insulation film when voltage application to the gate electrode ceases. Therefore, the dielectric breakdown of the gate insulation film can be improved and the reliability of the gate insulation film can be improved while the original function of MOSFET is maintained.

The semiconductor apparatus according to the present invention preferably has one surface of the base layer exposed as a band-like base layer partial surface on one surface of the semiconductor such that the surfaces of the first portions and the surfaces of the second portions are respectively arranged along the base layer partial surface, on each side in the direction of the width of the base layer partial surface, are arranged sequentially outward from each side, along a direction of width of the base layer partial surface, and the surfaces of the first portions and the surfaces of the second portions extend along an extending direction perpendicular to the width direction of the base layer partial surface. According to the present invention, the base layer partial surface can be used as a common surface for the surfaces of the first portions and the surfaces of the second portions on the sides in the direction of the width, and the semiconductor device can be simplified.

The semiconductor apparatus according to the present invention preferably has multiple base layer partial surfaces disposed on one surface of the semiconductor such that the base layer partial surfaces are arranged in parallel with each other at intervals. According to the present invention, the base layer partial surfaces can be used as common surfaces for the surfaces of the first portions and the surfaces of the second portions on the sides in the direction of the width, and the semiconductor device can be simplified as a whole.

The semiconductor apparatus according to the present invention preferably has multiple base layer partial surfaces disposed on one surface of the semiconductor such that the multiple base layer partial surfaces are arranged in a pair of outside lines disposed in parallel at an interval and intermediate rows positioned between the paired outside lines, that in each of the outside lines, the base layer partial surfaces are arranged to be aligned and face each other, at intervals outward along the direction of width, and that in the intermediate rows, the base layer partial surfaces are disposed between respective adjacent base layer partial surfaces in the outside lines, extending in the direction of the parallel disposition. According to the present invention, not only can the base layer partial surfaces be used as common surfaces for the surfaces of the first portions and the surfaces of the second portions on the sides in the direction of the width in the outside rows, the surfaces of the first portions and the surfaces of the second portions used in the pair of the outside lines can be used as common surfaces for the base layer partial surfaces in the intermediate rows. Therefore, the semiconductor device can further be simplified overall.

Effect of the Invention

The semiconductor device according to the present invention produces the effect that the dielectric breakdown and the reliability of the insulation film can be improved while the original function of MOSFET is maintained.

BEST MODE(S) FOR CARRYING OUT THE INVENTION

Figure 1:
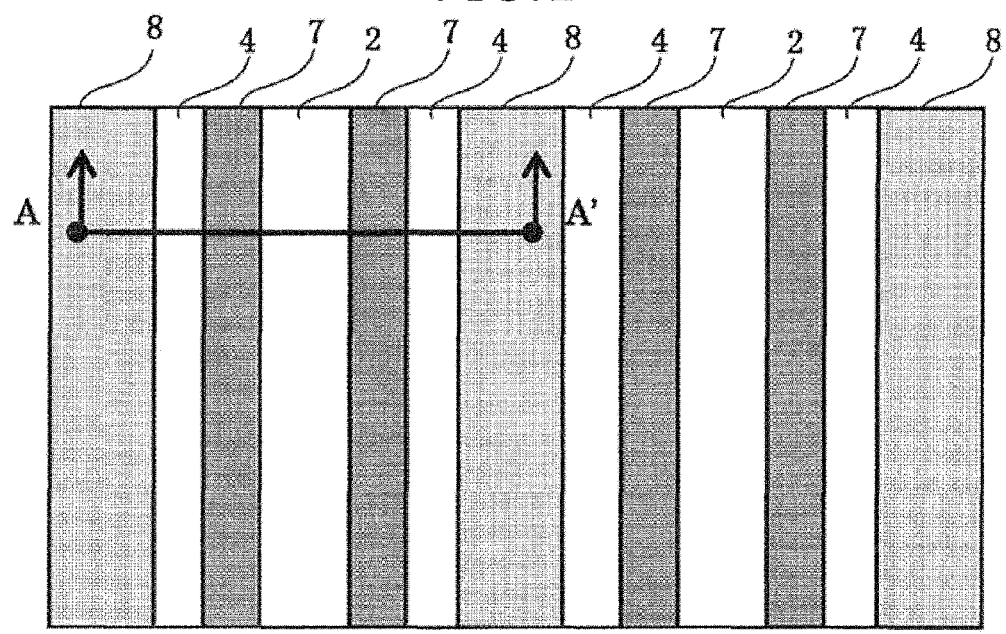
FIG. 1 is a plane view of a MOSFET in a first embodiment of the present invention.
Figure 2:
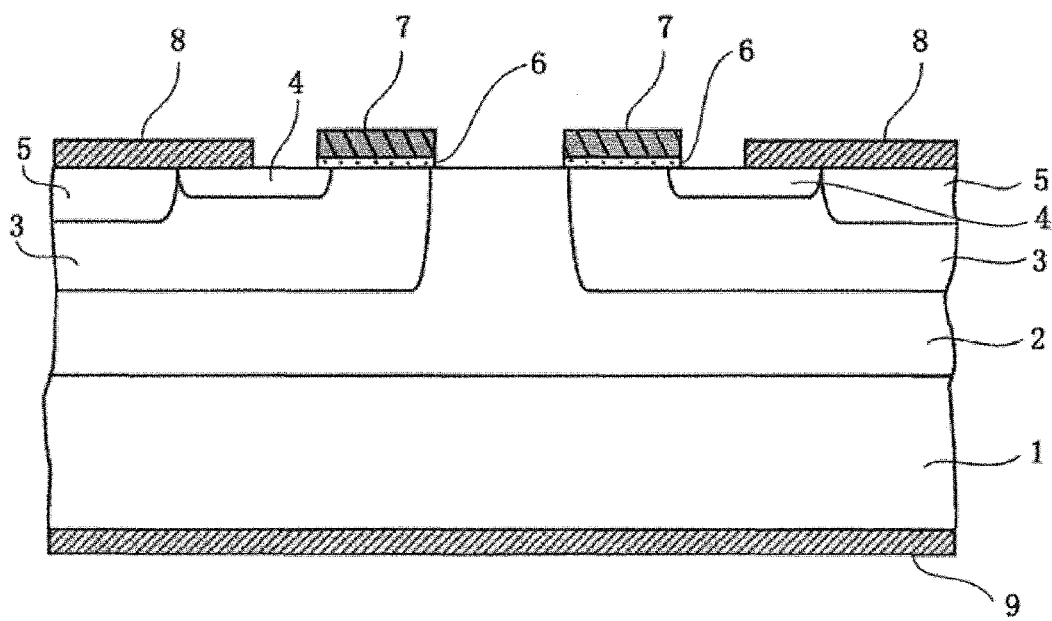
FIG. 2 is an enlarged cross-sectional view of a cross-sectional structure along a cut line A-A' of FIG. 1.
Figure 3:
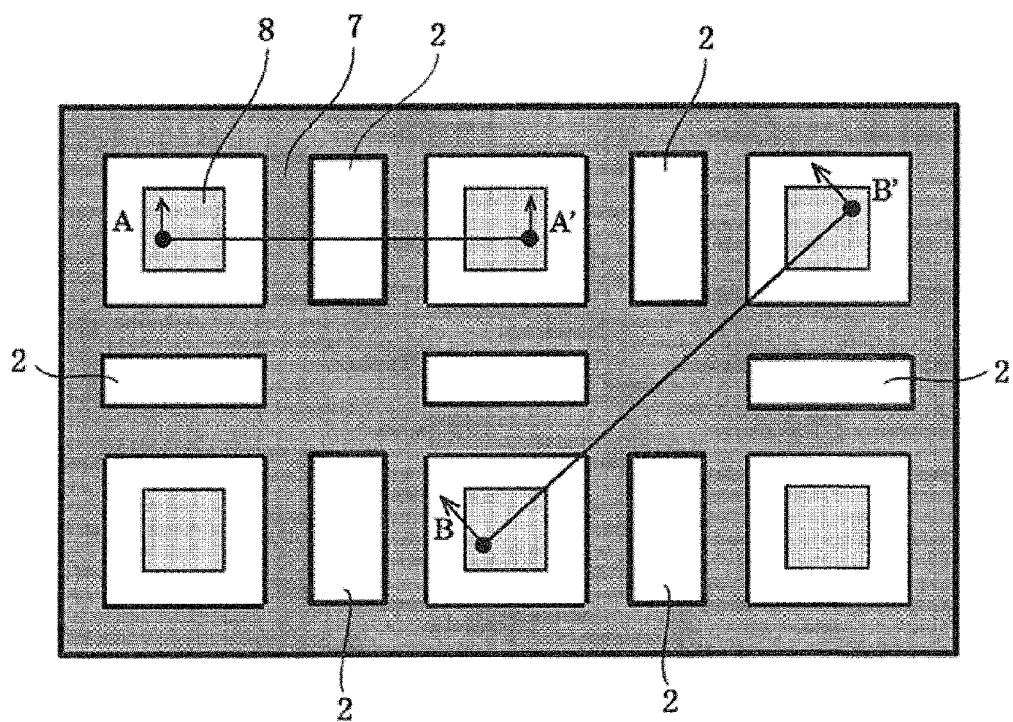
FIG. 3 is a plane view of a MOSFET in a second embodiment of the present invention.
Figure 4:
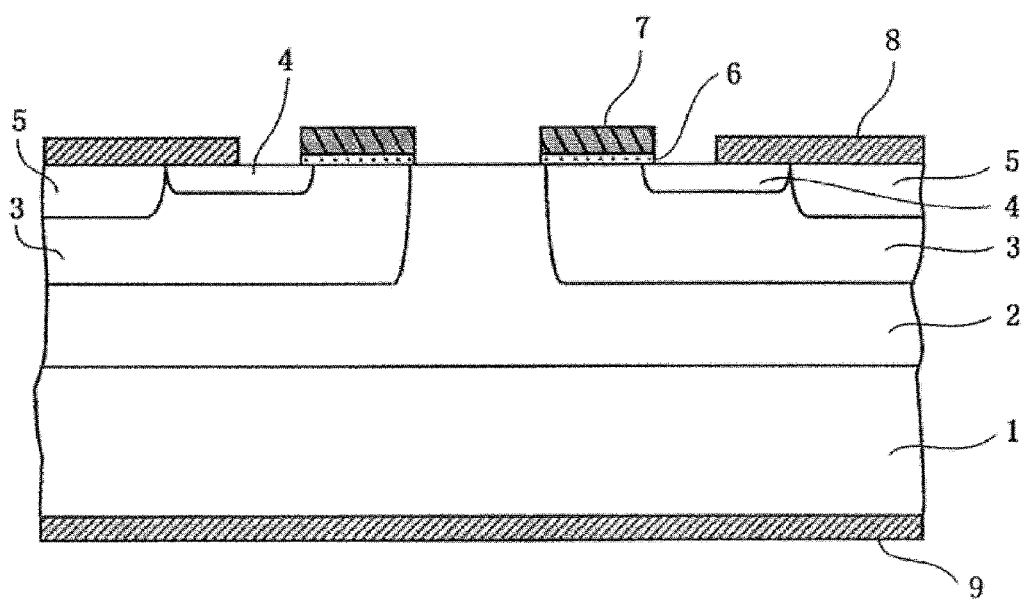
FIG. 4 is an enlarged cross-sectional view of a cross-sectional structure along a cut line A-A' of FIG. 3.
Figure 5:
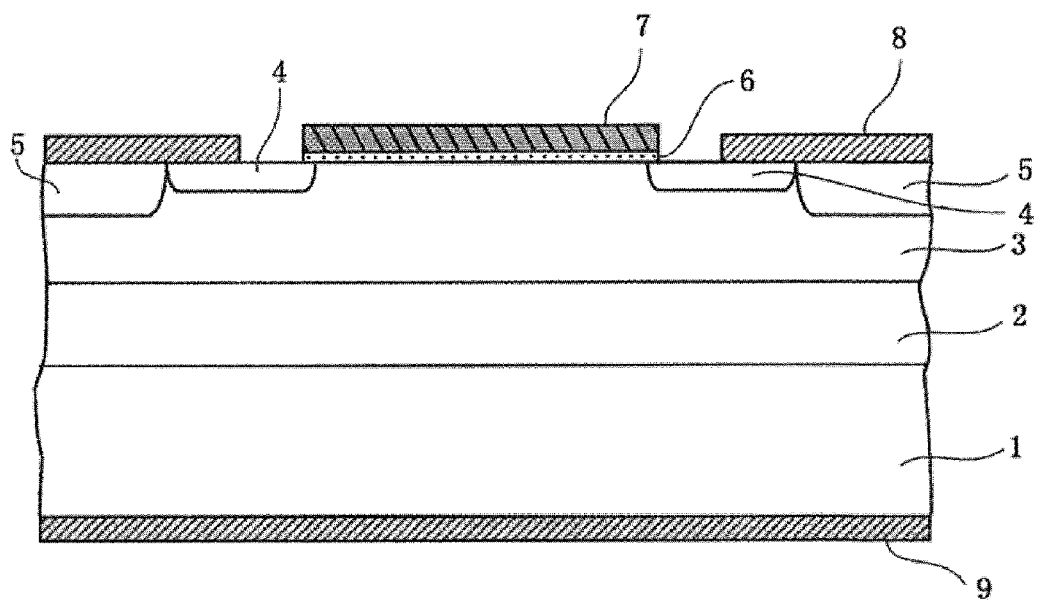
FIG. 5 is an enlarged cross-sectional view of a cross-sectional structure along a cut line B-B' of FIG. 3.
Figure 6:
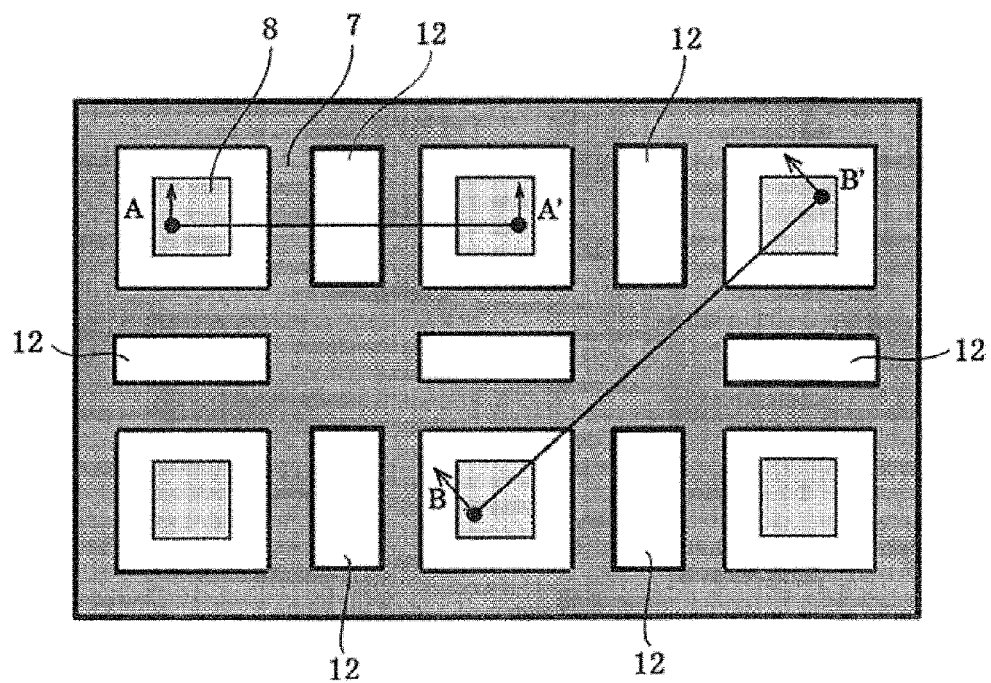
FIG. 6 is a plane view of a MOSFET in a third embodiment of the present invention.
Figure 7:
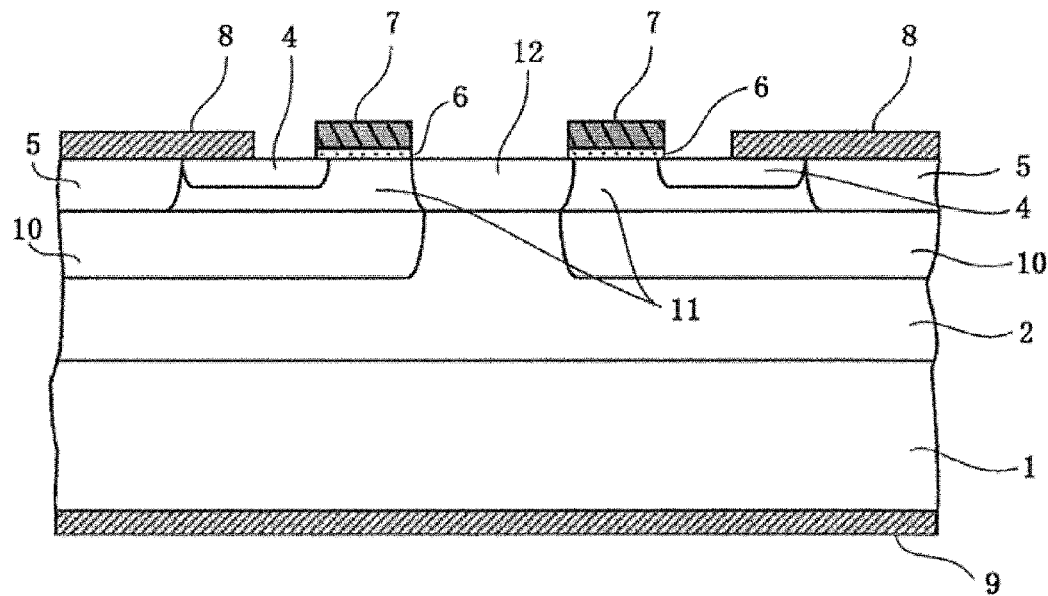
FIG. 7 is an enlarged cross-sectional view of a cross-sectional structure along a cut line A-A' of FIG. 6.
Figure 8:
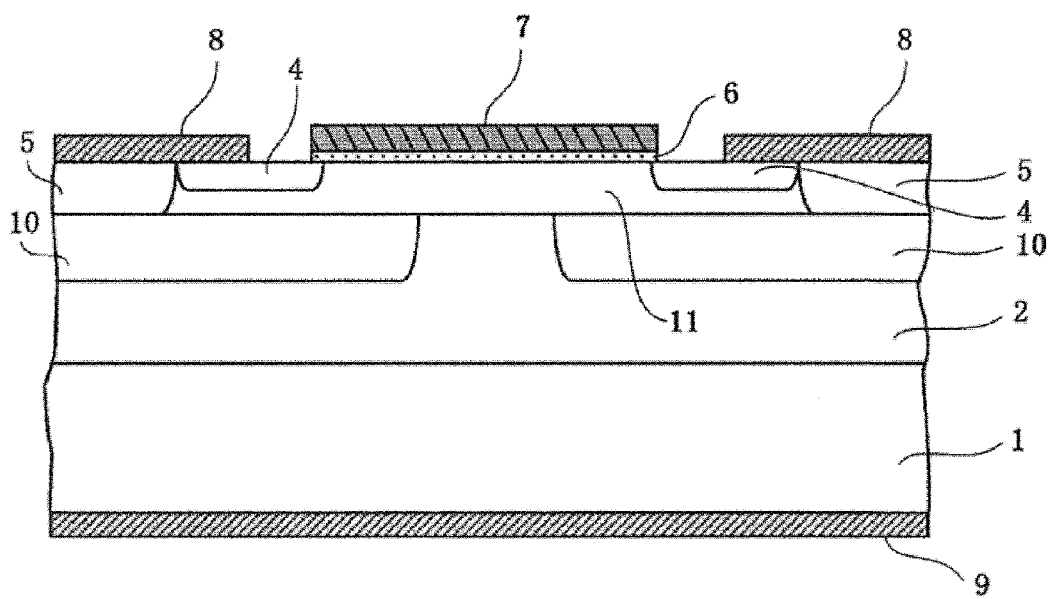
FIG. 8 is an enlarged cross-sectional view of a cross-sectional structure along a cut line B-B' of FIG. 6.
Figure 9:
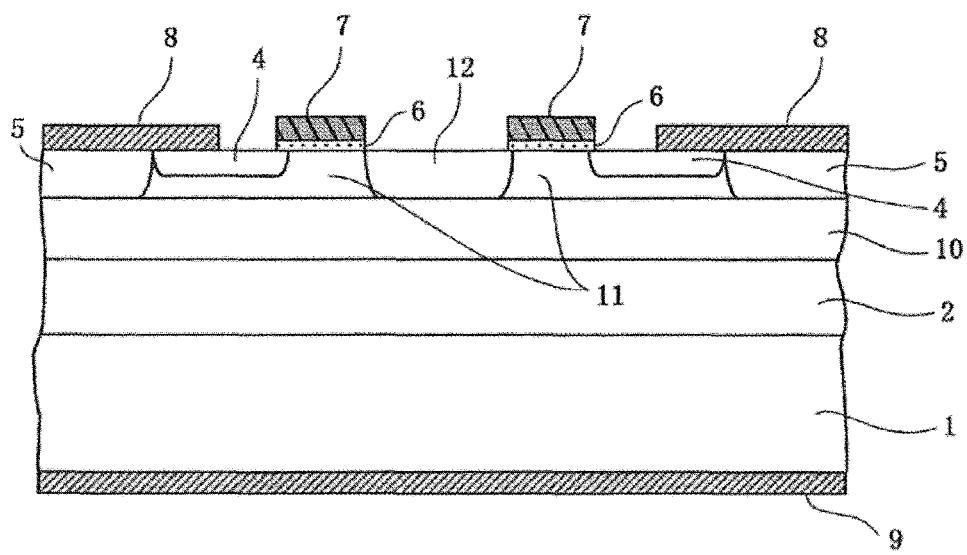
FIG. 9 is a cross-sectional view of a MOSFET in a fourth embodiment of the present invention (corresponding to a cross-sectional structure along the cut line A-A' of FIG. 6)
Figure 10:
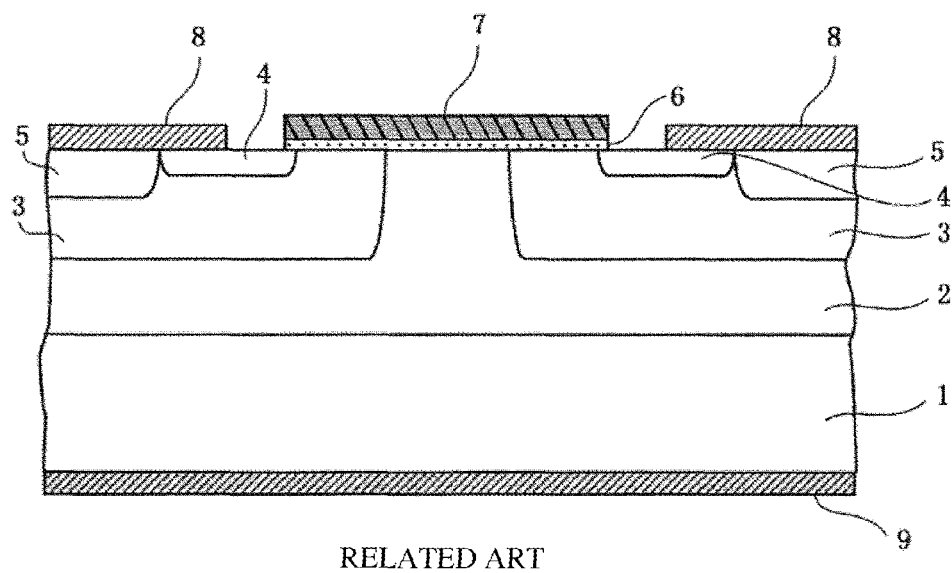
FIG. 10 is a cross-sectional diagram of a cross section structure of a conventional MOSFET.
Figure 11:
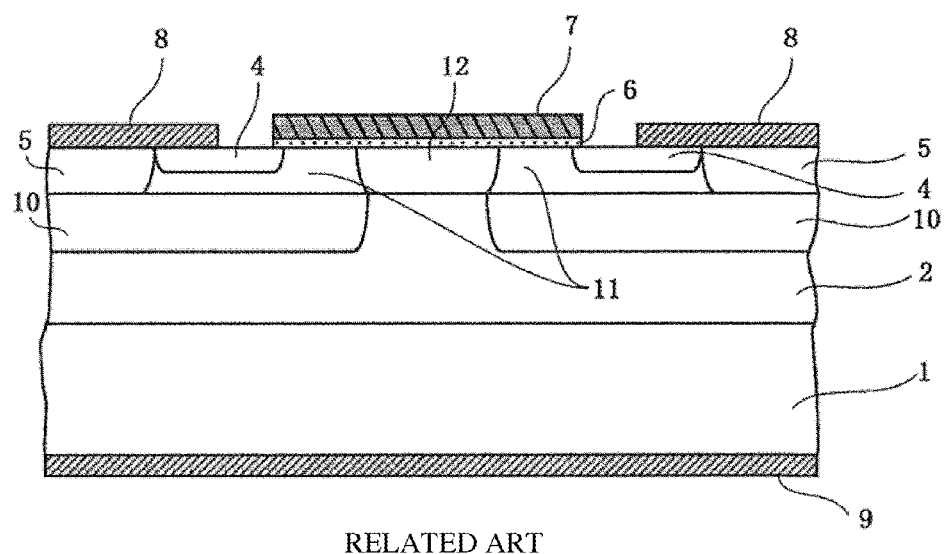
FIG. 11 is a cross-sectional diagram of a cross section structure of another conventional MOSFET.

Preferred embodiments of the present invention will now be described in detail with reference to the accompanying drawings. In this description and the accompanying drawings, layers and regions prefixed with N or P mean that electrons or positive holes are majority carriers. FIGS. 1 and 2 depict a first embodiment; FIGS. 3 to 5 depict a second embodiment, FIGS. 6 to 8 depict a third embodiment; and FIG. 9 depicts a fourth embodiment. In the embodiments, constituent elements identical to the constituent elements related to the conventional structures depicted in FIGS. 10 and 11 are denoted by the same reference numerals used in FIGS. 10 and 11. Although a first conduction type and a second conduction type are an N-type and a P-type, respectively, in the description, the types may be reversed.

First Embodiment

The first embodiment will be described. FIG. 1 is a plane view of a MOSFET in the first embodiment of the present invention. FIG. 2 is an enlarged cross-sectional view of a cross-sectional structure along a cut line A-A' of FIG. 1. In the first embodiment depicted in FIGS. 1 and 2, a base layer is used that has an N-type SiC layer 2 formed on a surface on the front surface side (one surface side) of an N-type SiC substrate 1, and multiple P-type regions 3 are formed as first portions in a surface layer of the N-type SiC layer 2 (a surface layer on the opposite side to the N-type SiC substrate 1 side). An N-type source region 4 and a P-type contact region 5 are respectively selectively formed as a second portion in a surface layer of the P-type region 3 (a surface layer on the opposite side to the N-type SiC substrate 1 side). A source electrode 8 is formed on the surfaces of the N-type source region 4 and the P-type contact region 5. A gate electrode 7 is formed via a gate insulation film (oxide film) 6 only on a surface of the P-type region 3. A drain electrode 9 is formed on the back surface side (the other surface side) of the N-type SiC substrate 1. In this case, the N-type SiC layer 2 is formed with an impurity concentration such as a nitrogen ion concentration set lower than the impurity concentration in the N-type SiC substrate 1.

In such a vertical MOSFET according to the first embodiment, when positive voltage is applied to the drain electrode 9 relative to the source electrode 8, if voltage less than a gate threshold value is applied to the gate electrode 7, the PN-junction between the P-type region 3 and the N-type SiC layer 2 (see FIG. 2) is inversely-biased and therefore, no current flows. On the other hand, if voltage equal to or greater than the gate threshold value is applied to the gate electrode 7, the formation of an inversion layer on the surface of the P-type region 3 immediately below the gate electrode 7 causes a current to flow. Therefore, the vertical MOSFET according to the first embodiment can achieve the switching operation of the MOSFET by the voltage applied to the gate electrode 7 and can fulfill the original function of the MOSFET.

In the vertical MOSFET according to the first embodiment, since the gate electrode 7 is disposed only on the surface of the P-type region 3 and the surface of the N-type SiC layer 2 defined as a portion of the surface of the base layer is excluded as an arrangement position of the gate electrode 7, a high electric field is no longer applied to the gate insulation film 6 on the surface of the N-type SiC layer 2, when voltage application to the gate electrode 7 ceases. Therefore, the dielectric breakdown of the gate insulation film 6 does not occur and the reliability of the element is improved.

In this case, the gate electrode 7 may be disposed on the surface of the P-type region 3 such that a surface other than the surface of the P-type region 3 is included, exclusive of the surface of the N-type SiC layer 2. The gate insulation film 6 may be disposed on the surface of the N-type SiC layer 2.

As depicted in FIG. 1, in the top view of the MOSFET structure in the first embodiment, the surface of the N-type SiC layer 2 is exposed as a band-like partial surface, where along the direction of width of the partial surface, the P-type region 3 (the gate insulation film 6 and the gate electrode 7), the N-type source region 4, and the source electrode 8 arranged parallel to each other (arranged in stripes) on both sides of the partial surface. The direction of width is a direction orthogonal to a direction along which the band-like partial surface consisting of the exposed surface of the N-type SiC layer 2 (hereinafter referred to as a partial surface of the N-type SiC layer 2 surface) extends. Therefore, the partial surface of the N-type SiC layer 2 surface can be used as a common surface for the P-type region 3 (the gate insulation film 6 and the gate electrode 7), the N-type source region 4, and the source electrode 8, and the semiconductor device can be simplified.

As described, according to the first embodiment, since the gate electrode is disposed only on the surface of the P-type region without disposing the gate electrode 7 on the N-type SiC layer surface, the dielectric breakdown of the gate insulation film can be improved and the reliability of the gate insulation film can be improved while the original function of the MOSFET is maintained.

Second Embodiment

The second embodiment will be described. FIG. 3 is a plane view of a MOSFET in the second embodiment of the present invention. FIG. 4 is an enlarged cross-sectional view of a cross-sectional structure taken along a line A-A' of FIG. 3. FIG. 5 is an enlarged cross-sectional view of a cross-sectional structure along a cut line B-B' of FIG. 3. Although the front surface structure of the MOSFET according to the first embodiment has a striped cell structure, the second embodiment depicted in FIGS. 3 to 5 has a rectangular cell structure with the surface of the N-type SiC layer 2 exposed as a rectangular partial surface. As depicted in the cross sectional views of FIGS. 4 and 5, in a portion of the gate electrodes 7 connected on a plane, the P-type regions 3 are also formed in a connected manner (see FIGS. 3 to 5 for comparison).

According to the second embodiment, even in the MOSFET with the P-type region 3 formed such that the partial surfaces of the N-type SiC layer 2 surface are formed into a rectangular cell shape as described above, since the gate electrode 7 is disposed only on the surface of the P-type region 3 and the surface of the N-type SiC layer 2 is excluded as an arrangement position of the gate electrode 7, the same characteristics as the first embodiment can be obtained in terms of the dielectric breakdown and the reliability of the gate insulation film 6. In this case, the front surface structure may obviously have a polygonal or circular cell structure other than the rectangular cell structure.

As depicted in FIG. 3, the surface of the N-type SiC layer 2 is exposed as multiple band-like partial surfaces on a plane, and the partial surfaces of the N-type SiC layer 2 surface are arranged in a pair of outside lines disposed in parallel at an interval (left and right lines of FIG. 3) and an intermediate row positioned between the paired outside lines (a row between the left and right lines of FIG. 3). In each of the outside lines, the partial surfaces of the N-type SiC layer 2 surface are arranged to be aligned and face each other, at intervals along the direction of width. In the intermediate row, the partial surfaces of the N-type SiC layer 2 surface are disposed between respective adjacent partial surfaces of the N-type SiC layer 2 surface in the outside lines and extend along the direction of the parallel disposition. Therefore, not only can the partial surfaces of the N-type SiC layer 2 surface be used as common surfaces for the surfaces of the P-type regions 3, the surfaces of the N-type source regions 4, etc. on both sides in the direction of width in the outside rows, the surfaces of the P-type regions 3, the surfaces of the N-type source regions 4, etc. used in the pair of the outside lines can be used as common surfaces for the partial surfaces of the N-type SiC layer 2 surface in the intermediate row. Therefore, the semiconductor device can further be simplified overall.

Third Embodiment

The third embodiment will be described. FIG. 6 is a plane view of a MOSFET in the third embodiment of the present invention. FIG. 7 is an enlarged cross-sectional view of a cross-sectional structure along a cut line A-A' of FIG. 6. FIG. 8 is an enlarged cross-sectional view of a cross-sectional structure taken along a line B-B' of FIG. 6. Although the plane structure is the same as the MOSFET plane diagram (FIG. 3) in the second embodiment, the third embodiment depicted in FIGS. 6 to 8 has a different internal structure.

In the third embodiment, a base layer is used that has the N-type SiC layer 2 formed on the surface of the N-type SiC substrate 1, and multiple P-type regions 10 are formed in the surface layer of the N-type SiC layer 2 (the surface layer on the opposite side to the N-type SiC substrate 1 side). A P-type SiC layer 11 is formed on a surface of the P-type region 10. The P-type SiC layer 11 has an N-type region 12 penetrating the P-type SiC layer 11 in the depth direction to reach the N-type SiC layer 2. The N-type region 12 preferably has a concentration higher than the N-type SiC layer 2. This is because the N-type region 12 acts as an accumulation layer and, when the accumulation layer has a higher concentration, on-resistance in the accumulation layer portion can be reduced. The N-type source region 4 and the P-type contact region 5 are respectively selectively formed in a surface layer of the P-type SiC layer 11 (a surface layer on the opposite side to the N-type SiC substrate 1 side). The source electrode 8 is formed on the surfaces of the N-type source region 4 and the P-type contact region 5. The gate electrode 7 is formed via the gate insulation film 6 on the surface of the P-type SiC layer 11 and, as depicted in FIG. 8, the N-type region 12 is not formed in a region under the gate electrode 7 connecting cells, and the P-type SiC layer 11 is formed in a connected manner without being divided by the N-type region 12. The drain electrode 9 is formed on the back surface side of the N-type SiC substrate 1. The relationship of impurity concentrations of the P-type SiC layer 11, the P-type region 10, and the P-type contact region 5 satisfies the P-type SiC layer 11<the P-type region 10<the P-type contact region 5. The P-type region 10 and the P-type SiC layer 11 make up a first portion and the N-type source region 4 makes up a second portion.

According to the third embodiment, even in the MOSFET with the P-type SiC layer 11 and the N-type region 12 formed as described above, since the gate electrode 7 is disposed only on the surface of the P-type SiC layer 11 and the surface of the N-type region 12 is excluded as an arrangement position of the gate electrode 7, the same characteristics as the first embodiment can be acquired in terms of the dielectric breakdown and the reliability of the gate insulation film 6. In this case, the unit cell structure may obviously have a polygonal or circular cell structure other than the rectangular cell structure and may have a striped cell structure as is the case with the first embodiment.

Fourth Embodiment

The fourth embodiment will be described. FIG. 9 is a cross-sectional view of a MOSFET in the fourth embodiment of the present invention (corresponding to a cross-sectional structure along the cut line A-A' of FIG. 6). Although the MOSFET cell layout is the same as that (FIG. 6) in the second embodiment, the fourth embodiment depicted in FIG. 9 has a different internal structure.

In the fourth embodiment, a structure of the gate electrode 7 portion connecting cells is different from the third embodiment and is formed such that the N-type region 12 is formed to divide the P-type SiC layer 11 and, in a region under the N-type region 12, the P-type region 10 formed on the N-type SiC layer 2 is formed in a connected manner without being divided by the N-type SiC layer 2.

According to the fourth embodiment, even in the MOSFET with the P-type region 10 uniformly formed between the N-type region 12/the P-type SiC layer 11 and the N-type SiC layer 2 as described above, since the gate electrode 7 is disposed only on the surface of the P-type SiC layer 11 and the surface of the N-type region 12 is excluded as an arrangement position of the gate electrode 7, the same characteristics as the first embodiment can be obtained in terms of the dielectric breakdown and the reliability of the gate insulation film 6.

INDUSTRIAL APPLICABILITY

As described, the semiconductor device according to the present invention is useful for a power semiconductor device used as a switching device.

EXPLANATIONS OF LETTERS OR NUMERALS

1 N-type silicon carbide substrate (base layer)
2 N-type silicon carbide layer (base layer)
3 P-type region (first portion)
4 N-type source region (second portion)
6 gate insulation film (insulation film)
7 gate electrode
8 source electrode
9 drain electrode
10 P-type base region (first portion)
11 P-type silicon carbide layer (first portion)
12 N-type region (base layer)

The invention claimed is:

1. A semiconductor device comprising:
a source electrode formed on a first surface of a semiconductor;
a gate electrode formed via an insulation film on the first surface of the semiconductor; and
a drain electrode formed on a second surface of the semiconductor, wherein
the semiconductor has:
a base layer performing a function of a first conductive type among N and P types,
a first portion partially formed in a surface layer of a first surface of the base layer to perform a function of a second conductive type among N and P types, and
a second portion partially formed inside the first portion to perform a function of the first conductive type, the second portion being connected to the source electrode,
the first surface of the base layer, a surface of the first portion, and a surface of the second portion are exposed as constituent surfaces of the first surface of the semiconductor,
the first portion is positioned to be interposed between the base layer and the second portion on the first surface side of the base layer,
a second surface of the base layer is the second surface of the semiconductor,
the gate electrode is disposed on the surface of the first portion such that the first surface of the base layer is completely excluded as an arrangement position of the gate electrode, the first portion directly contacting the base layer at the first surface of the semiconductor;
the base layer is made up of:
a silicon carbide substrate performing a function of the first conductive type, and
a first silicon carbide layer formed on a first surface of the silicon carbide substrate, having an impurity concentration that is lower than an impurity concentration of the silicon carbide substrate, and performing a function of the first conductive type,
the drain electrode is connected to a second surface of the silicon carbide substrate, and
the first portion is formed inside the first silicon carbide layer.

2. The semiconductor device according to claim 1, wherein
the first surface of the base layer is exposed as a band-like base layer partial surface on the first surface of the semiconductor,
the surface of the first portion and the surface of the second portion are respectively arranged along the base layer partial surface, on each side in the width direction of the base layer partial surface, and are arranged sequentially outward from the each side, along a width direction of the base layer partial surface, and
the surface of the first portion and the surface of the second portion are extended along an extending direction perpendicular to the width direction of the base layer partial surface.

3. The semiconductor device according to claim 2, wherein
the base layer partial surfaces are disposed in plural on the first surface of the semiconductor, and
the base layer partial surfaces are arranged to be parallel with one another at a given interval.

4. The semiconductor device according to claim 2, wherein
the base layer partial surfaces are disposed in plural on the first surface of the semiconductor,
the base layer partial surfaces are arranged in a pair of outside lines disposed in parallel at an interval and an intermediate row positioned between the pair of outside lines,
in each of the outside lines, the base layer partial surfaces are arranged to be aligned and face one another, at intervals outward along a direction of width, and
in the intermediate row, the base layer partial surfaces are disposed between the respective adjacent base layer partial surfaces in the outside lines and extend along a direction of the parallel disposition.

5. The semiconductor device according to claim 1, wherein
the first portion is made up of:
a first region formed inside the first silicon carbide layer and performing a function of the second conductive type, and
a second silicon carbide layer formed on a surface of the first silicon carbide layer and a surface of the first region to perform a function of the second conductive type,
the second portion is formed inside the second silicon carbide layer, and
the base layer includes an extension region formed inside the second silicon carbide layer and continued to the first silicon carbide layer to perform a function of the first conductive type same as the base layer.

6. The semiconductor device according to claim 2, wherein
the first portion is made up of:
a first region formed inside the first silicon carbide layer and performing a function of the second conductive type, and
a second silicon carbide layer formed on a surface of the first silicon carbide layer and a surface of the first region to perform a function of the second conductive type,
the second portion is formed inside the second silicon carbide layer, and
the base layer includes an extension region formed inside the second silicon carbide layer and continued to the first silicon carbide layer to perform a function of the first conductive type same as the base layer.

7. The semiconductor device according to claim 3, wherein
the first portion is made up of:
a first region formed inside the first silicon carbide layer and performing a function of the second conductive type, and
a second silicon carbide layer formed on a surface of the first silicon carbide layer and a surface of the first region to perform a function of the second conductive type,
the second portion is formed inside the second silicon carbide layer, and
the base layer includes an extension region formed inside the second silicon carbide layer and continued to the first silicon carbide layer to perform a function of the first conductive type same as the base layer.

8. The semiconductor device according to claim 4, wherein
the first portion is made up of:
a first region formed inside the first silicon carbide layer and performing a function of the second conductive type, and
a second silicon carbide layer formed on a surface of the first silicon carbide layer and a surface of the first region to perform a function of the second conductive type,
the second portion is formed inside the second silicon carbide layer, and
the base layer includes an extension region formed inside the second silicon carbide layer and continued to the first silicon carbide layer to perform a function of the first conductive type same as the base layer.

9. A semiconductor device comprising
a source electrode formed on a first surface of a semiconductor;
a gate electrode formed via an insulation film on the first surface of the semiconductor; and
a drain electrode formed on a second surface of the semiconductor, wherein
the semiconductor has:
a base layer performing a function of a first conductive type among N and P types,
a first portion partially formed in a surface layer of a first surface of the base layer to perform a function of a second conductive type among N and P types, and
a second portion partially formed inside the first portion to perform a function of the first conductive type, the second portion being connected to the source electrode,
the first surface of the base layer, a surface of the first portion, and a surface of the second portion are exposed as constituent surfaces of the first surface of the semiconductor,
the first portion is positioned to be interposed between the base layer and the second portion on the first surface side of the base layer,
the surface of the first portion exposed as a constituent surface of the first surface of the semiconductor directly contacts the first surface of the base layer exposed as a constituent surface of the first surface of the semiconductor, the base layer having a uniform concentration of the first conductive type at least at the constituent surface thereof,
a second surface of the base layer is the second surface of the semiconductor,
the gate electrode is formed to be continuous between a corner of the second portion and a corner of a given second portion that does not face an edge of the second portion, and is formed to be discontinuous between the edge of the second portion and an edge of an arbitrary second portion that faces the edge of the second portion, and wherein each of the second portion, the given second portion and the arbitrary second portion are individually surrounded by the gate electrode;
a portion of the gate electrode completely surrounds the discontinuity between the edge of the second portion and the edge of the arbitrary second portion.

* * * * *